United States Patent
Hsiung

(10) Patent No.: US 7,375,365 B2
(45) Date of Patent: May 20, 2008

(54) MULTILEVEL PHASE-CHANGE MEMORY, MANUFACTURE METHOD AND OPERATING METHOD THEREOF

(75) Inventor: Chih-Wen Hsiung, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 342 days.

(21) Appl. No.: 11/104,429

(22) Filed: Apr. 13, 2005

(65) Prior Publication Data

US 2006/0097239 A1 May 11, 2006

(30) Foreign Application Priority Data

Nov. 9, 2004 (TW) ............................... 93134142 A

(51) Int. Cl.
*H01L 47/00* (2006.01)
(52) U.S. Cl. ...................... 257/2; 257/4; 257/5; 438/95
(58) Field of Classification Search ................ 257/2–5; 438/95; 437/95
See application file for complete search history.

(56) References Cited

U.S. PATENT DOCUMENTS 5,920,788 A * 7/1999 Reinberg .................... 438/466

OTHER PUBLICATIONS

Y.N. Hwang et al., Writing Current Reduction for High-density Phase-change RAM IEDM 893-896, 2003.
A. Piroveno et al., Scaling Analysis of Phase-Change Memory IEDM pp. 669-702, 2003.
Y.H. Ha et al., An Edge Contract Type Cell for Phase Change RAM Featuring Very Low Power Consumption, Symposium on VLSI Technology Digest of Technical Papers pp. 175-176, 2003.

* cited by examiner

*Primary Examiner*—Theresa T Doan
(74) *Attorney, Agent, or Firm*—Birch, Stewart, Kolasch & Birch, LLP

(57) ABSTRACT

A multilevel phase-change memory, manufacture method and operating method thereof are provided. The memory includes a first phase change layer, a second phase change layer, a first heating layer formed on one surface of the first phase change layer, a second heating layer formed between the first heating layer and the second phase change layer, a first top electrode formed on another surface of the first phase change layer, a second top electrode formed on the other surface of the second phase change layer, and a bottom electrode formed on the other surface of the first heating layer corresponding to the second heating layer. Further, a substrate is provided to form the aforementioned components. The substrate may also include a transistor. The disclosed device has a multi memory state, thereby increasing the memory density, reducing the memory area and lowering the power consumption.

9 Claims, 6 Drawing Sheets

US 7,375,365 B2

MULTILEVEL PHASE-CHANGE MEMORY, MANUFACTURE METHOD AND OPERATING METHOD THEREOF

This application claims the benefit of Taiwan Patent Application No. 93134142, filed on Nov. 9, 2004, which is hereby incorporated by reference for all purposes as if fully set forth herein.

BACKGROUND OF THE INVENTION

1. Field of Invention

The present invention relates to a semi-conductor memory, and more particular, to a multilevel phase-change memory

2. Related Art

Most electronic equipment uses different types of memories, such as a DRAM, SRAM and Flash memory or the combination of these different types' memories based on the requirements of the application, the operating speed, the memory size and the cost consideration of the equipment. The current new developments in the memory field include FeRAM, MRAM and phase-change memory.

A Phase-change memory records data by changing the material of the semi-conductor circuit to different phase states due to the resistance changes inside of the circuit. Many materials, such as $Ge_2Sb_2Te_5$ and others, have the characteristics of changing to different crystallization states with different temperatures and different crystallization states have different resistance. Therefore, a phase-change memory using electrical heating can change materials, such as $Ge_2Sb_2Te_5$, into different crystallization states, each having different resistance, where each different state can represent a different recording state, i.e., 0 or 1. Moreover, a phase-change memory is non-volatile, it will retain data recorded even if the power is off. Therefore, during a data writing operation in a phase-change memory, the electrical current has to be supplied to the selected memory cells, which will cause phase transition after being heated up by heating electrodes. The current phase-change memory technology uses contact to make a phase area method, such as a structure combining phase-change memory and a CMOS transistor disclosed by Samsung Electronics Co., Ltd in IEDM 2003, which connects heating electrodes to the phase-change layer and uses the contact as a phase-change area. Also in IEDM 2003, STMicroelectronics & Ovonyx Inc. recommended another structure using the via as phase-change region, which fills the phase-change layer in the via to obtain a smaller switching current.

The above-referenced technology using the via to connect a heating electrode to a phase-change region will prevent making a high capacity memory. Therefore, the increase of a phase-change memory density is one key focus in the current memory technology development.

SUMMARY OF THE INVENTION

The present invention provides a multilevel phase-change memory and its associated manufacture method, which will solve several existing problems in the prior art.

Accordingly, the multilevel phase-change memory of the present invention includes a first phase-change layer, a second phase-change layer, a first heating layer formed on a first surface of the first phase-change layer, a second heating layer formed between the first phase-change layer and the second phase-change layer, a first top electrode formed on a second surface of the first phase-change layer, a second top electrode formed on a second surface of the second phase-change layer, and a bottom electrode formed on a second surface of the first heating layer opposite to the second heating layer.

The multilevel phase-change memory further includes a substrate with a transistor, and the bottom electrode is formed on the substrate.

Further, the manufacture method of a multilevel phase-change memory includes providing a substrate with a transistor formed thereon, forming a bottom electrode on the substrate, forming a first heating layer on top of the bottom electrode, forming a second heating layer on top of the first heating layer, forming a phase-change layer on top of the second heating layer, etching the phase-change layer to form a first phase-change layer and a second phase-change layer, and forming a first top electrode and a second electrode on top of the second phase-change layer opposite to the first phase-change layer.

Furthermore, the present invention provides an operating method of a multilevel phase-change memory including grounding the first top electrode and the second top electrode, and applying a pulse current to the bottom electrode, to make the first phase-change layer and the second phase-change layer change states thereof according to the pulse current. Moreover, the operation method further includes converting the first phase-change layer and the second phase-change layer into a non-crystal state before applying the pulse current.

Another operating method of a multilevel phase-change memory according to the present invention includes grounding the first top electrode and the second top electrode, and applying a pulse current to one of the first top electrodes and the second top electrodes.

The present invention utilizes a single transistor to control two different contact regions of phase-change area, which can achieve a higher recording density by realizing multiple recordings in a single memory cell, and increases the density of the memory and reduces the power consumption.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given here in below illustration only, and thus doesn't limit the present invention, wherein.

DETAILED DESCRIPTION OF THE INVENTION

Figure 1:
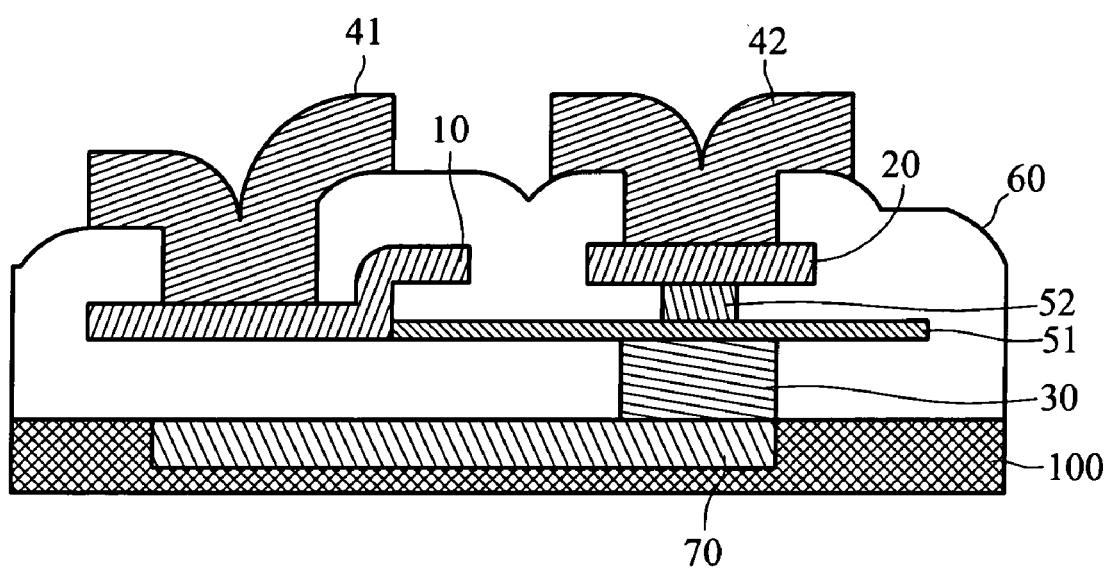
FIG. 1 is a structure of phase-change memory of the present invention.

With reference to FIG. 1, the present invention multilevel phase-change memory comprises a first phase-change layer 10, a second phase-change layer 20, a bottom electrode 30, a first top electrode 41 and a second top electrode 42, a first heating layer 51 and a second heating layer 52.

As shown in FIG. 1, the bottom electrode is formed on a substrate 100. There is a transistor 70 formed on the substrate 100 using a compatible manufacturing process. For example, the transistor can be either a P-type or an N-type MOSFET. If it is a P-type MOSFET, a P-type substrate is formed with the Group III element added in the substrate 100 and an N-type region formed with the Group V element is added in the transistor, which is connected to the bottom electrode 30 for signal transmitting. On the other hand, for an N-type MOSFET, an N-type substrate formed with a Group V element is added in the substrate 100, while a P-type region (P-well) formed with a Group III element is added in the transistor which is connected to the bottom electrode 30.

Furthermore, on top of the bottom electrode 30, a first heating layer 51 is formed, and then a second heating layer 52 is formed above. In the example shown in the FIG. 1, the area size of the first heating layer 51 is different from the area size of the second heating layer 52. However, in the other examples, the area size between the first heating layer 51 and the second heating layer 52 can be the same. As far as the material used for making the heating layer, it can be poly-Si, SiC, TiW, TiN and/or TiAlN.

The first phase-change layer 10 contacts the first heating layer 51, and the second phase-change layer 20 is formed on the second heating layer. On top of the first phase-change layer 10 is the first top electrode 41, and the second top electrode 42 is on top of the second phase-change layer 20. In one embodiment, the first phase-change layer 10 and the second phase-change layer can be made in the same step with similar material. In another embodiment, different material can be used in different steps, so each phase-change layers and the selections of different materials can be GeSbte, AgInSbTe, or GeInSbTe, etc. The bottom electrode 30, the first top electrode 41 and the second top electrode 42 can be made from a metal material. In addition, between each layer, there is an insulation layer 60 (such as, $SiO_2$, $Si_3N_4$, polymer etc) to separate them.

As the structure shown in the examples, when the memory is chosen by an outside control circuit through the transistor, the first phase-change layer 10 is heated by the first heating layer 51, and the second phase-change layer 20 is heated by the first heating layer 51 and the second heating layer 52 such, that due to characteristic of the material used in them, the heating will induce phase changes both in the first phase-change layer 10 and the second phase-change layer 20. According to the principle of the present invention, using two phase-change layers and a transistor form a memory cell, each phase-change layer has two states: crystal and non-crystal, and each phase-change layer can change its state by heating, therefore, two phase-change layers can form a multilevel phase-change memory.

Referring to FIG. 2A~2J, they is a manufacture process for multilevel phase-change memory of the present invention.

Figure 2A:
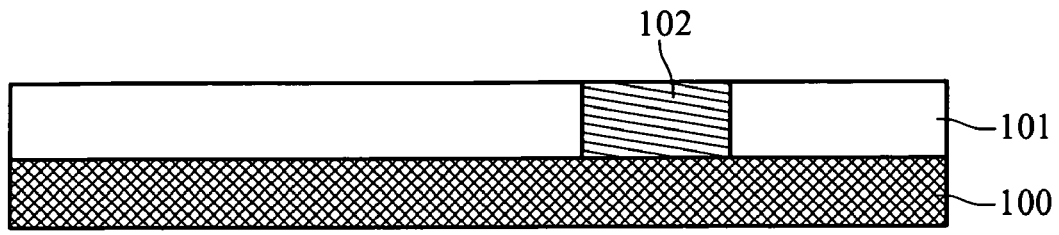
FIGS. 2A~2J illustrate different structures of the phase-change memory of the present invention during the manufacture process.

First, in a substrate 100, preferably a silicon substrate, a transistor may be formed if chosen; then an insulation layer 101 is laid on the top of the substrate 100; next, a guiding hole is etched on the insulation layer 101 and metal is filled into the hole to form the bottom electrode 102 as shown in FIG. 2A.

Figure 2B:
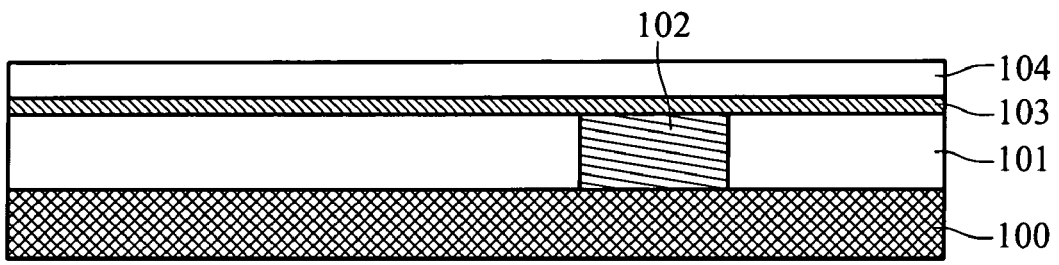

Then the first heating layer 103 is formed above the bottom electrode 102, and an insulation layer 104 is placed on top of the heating layer 103, as shown in FIG. 2B.

Figure 2C:
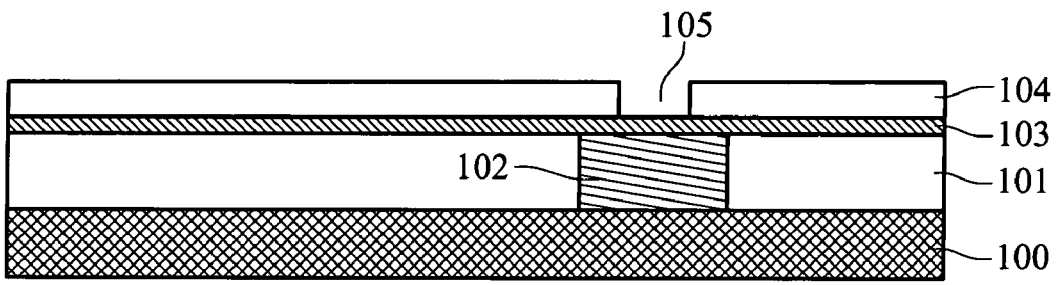
Figure 2D:
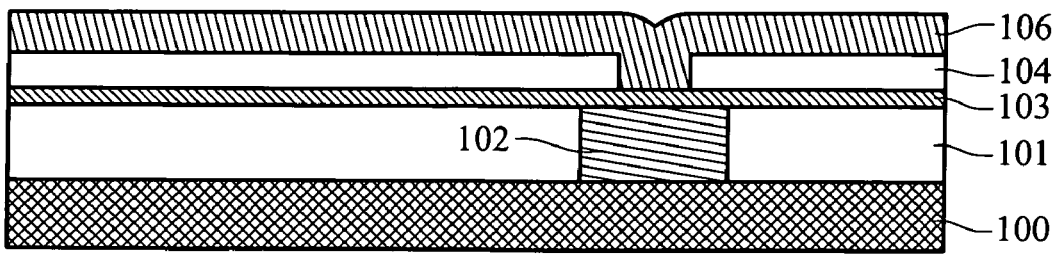

Next, a guiding hole 105 is etched on the insulation layer 104 which is also aligned with the bottom electrode 102; then the second heating layer 106 is formed on top of the insulation layer 104, as shown in FIG. 2C and 2D; through the guiding hole, the first heating layer 103 makes contact with the second heating layer 106 to be able to heat the phase-change layer in various degrees.

Then, after etching the second heating layer 106, the first heating layer 103 and the insulation layer 104 are etched into a form shown in 2E and 2F.

Figure 2E:
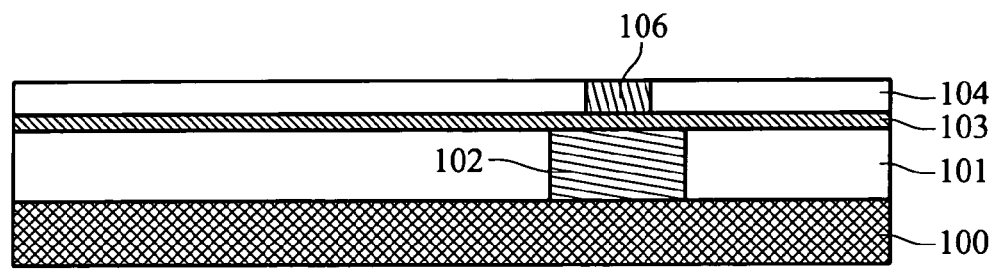
Figure 2F:
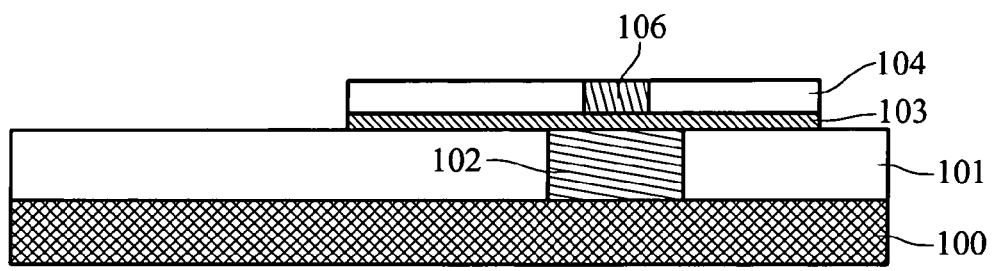
Figure 2G:
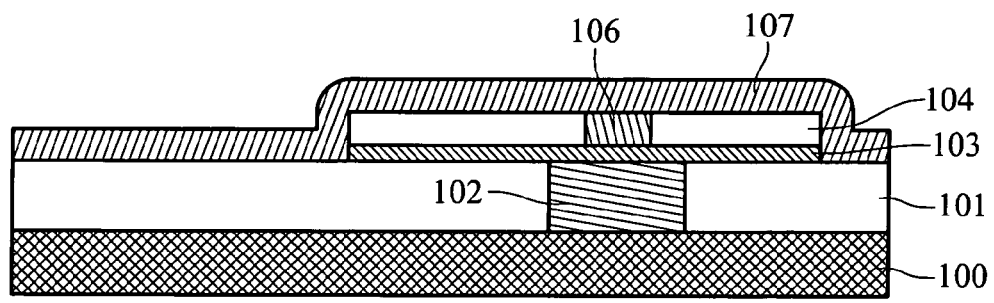
Figure 2H:
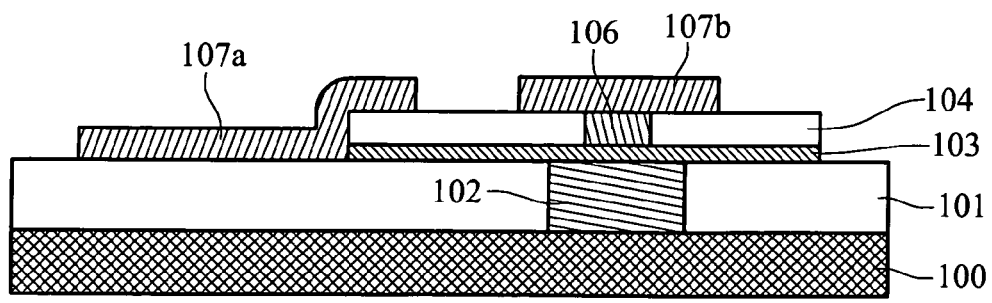
Figure 2I:
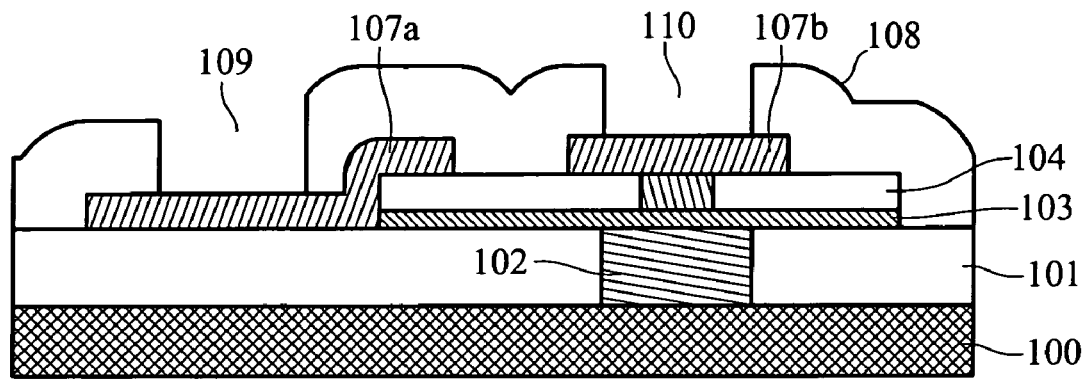
Figure 2J:
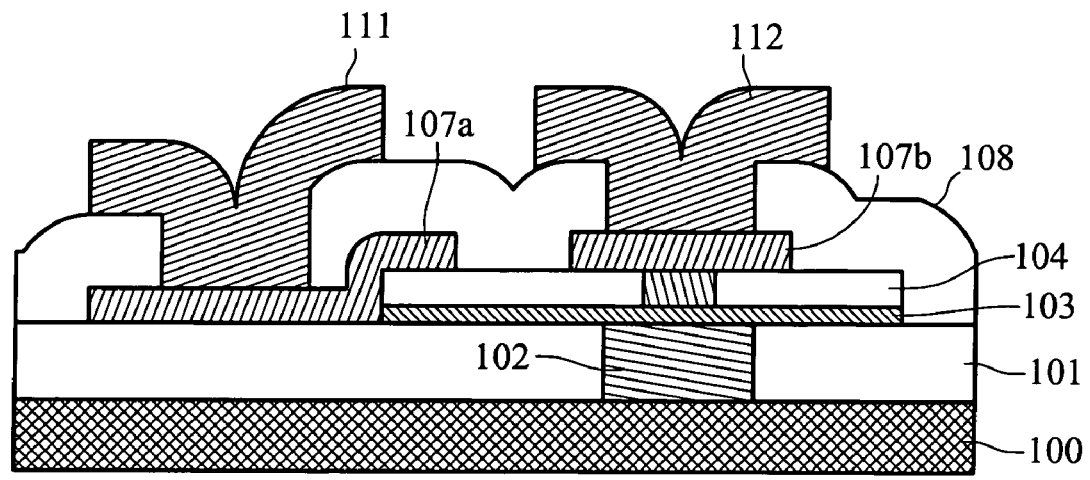

Next, a phase-change layer 107 is formed on top of the second heating layer 106 as shown in FIG. 2F and then it is etched into the first phase-change layer 107A and the second phase-change layer 107B; Then, an insulation layer 108 is formed and two guiding holes 109, 110 are etched, as shown in FIG. 2G~2I.

In this embodiment, the first phase-change layer and the second phase-change layer are made from the same material. In other embodiments, they can be made from different material. Finally, the first electrode 110 and second electrode 111 are formed as shown in FIG. 2I.

Figure 3A:
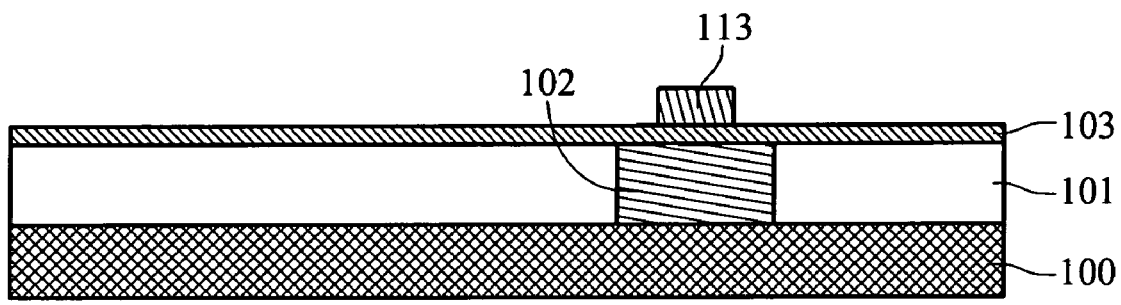
FIGS. 3A~3B illustrate other different structures of the phase-change memory of the present invention during the manufacture process.
Figure 3B:
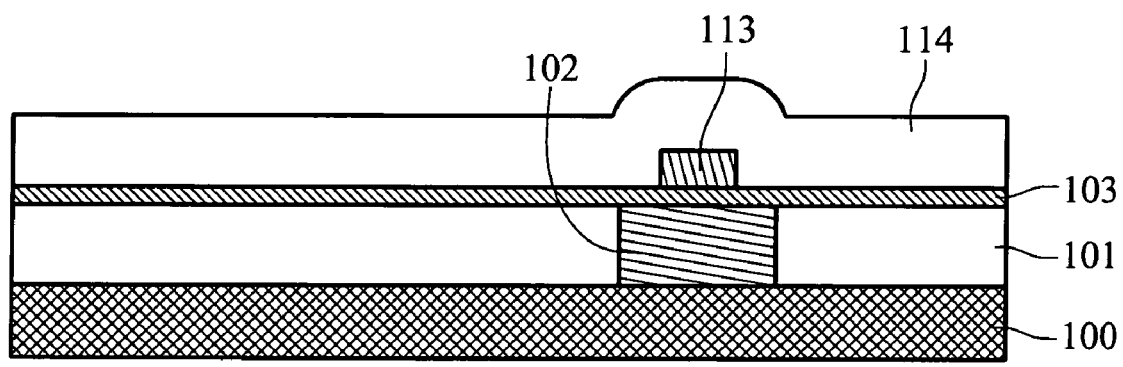

With reference to FIGS. 3A and 3B, another example of forming the second heating layer. The second heating layer 113 is formed by depositing and etching into a specified size, as shown in FIGS. 3A and 3B. Then, an insulation layer 114 is formed after etching above the second heating layer 114, as shown in FIG. 2E.

Assuming the phase-change ratios of two different phase-change layers (represented by PC1 and PC2) are PC1=$\frac{1}{10}$, PC2=$\frac{1}{5}$, and assuming the phase-change material is $Ge_2Sb_2Te_5$, its resistance in the crystal state is $10^{-2}$ Ω-cm, and its resistance in the non-crystal state is 100 Ω-cm; the resistances in crystal and non-crystal state of two different regions of phase-change layers during operation are shown in Table 1, where the component sizes are evaluated according to the TSMC manufacturing standard of 0.18 μm CMOS.

TABLE 1

| | Resistances | |
|---|---|---|
| | I. Crystal | A. Non-Crystal |
| PC1 | 714.3 Ω | 7.14 × 10$^5$ Ω |
| PC2 | 148 Ω | 2.96 × 10$^5$ Ω |

Also, assuming the electrode material of the first heating layer is TiN and its resistance is 28.6 Ω, and the electrode material of the second heating layer is SiC and its resistance is 2.4×10$^4$ Ω, then the resistance ratio between two corresponding conductors (two electrical current paths: An electrical current path is from the bottom electrode 30 via the first heating layer 51 and then to the first phase-change layer 10. Another electrical current path is from the bottom electrode 30, via the first heating layer 51 and the second heating layer 52 and then to the second phase-change layer 20) at non-crystal states are:

$$PC1:PC2 = (7.14 \times 10^5 + 28.6):(2.96 \times 10^5 + 2.4 \times 10^4)$$
$$= 2.23:1$$

Based on this resistance ratio, four different operation currents can be obtained; the phase-change relationship between the first phase-change layer and the second phase-change layer is as shown in Table 2:

TABLE 2

Operation current and phase-change

| Current(mA), Pulse interval | Phase-change layer | Current Density(mA/μm²) | States |
|---|---|---|---|
| 0.42, 50 nS | First PC Layer | 30 | Crystal |
|  | Second PC Layer | 13.8 | No Change |
| 0.7, 30 nS | First PC Layer | 50 | Non-Crystal |
|  | Second PC Layer | 23 | No Change |
| 2.0, 50 nS | First PC Layer | 64 | Crystal |
|  | Second PC Layer | 30 | Crystal |
| 3.38, 30 nS | First PC Layer | 108 | Non-Crystal |
|  | Second PC Layer | 50 | Non-Crystal |

Therefore, by applying different current pulse signals, four kinds of recording states can be achieved via the structure of two different phase-change layers.

According to the principle of the present invention, the first phase-change layer and the second phase-change layer shall be set to a non-crystal state, then by applying with different writing current pulses, it produces different heating resistances at the contact areas, having different phase changes of the first and the second phase-change layers, therefore, it achieves a multilevel recording operation. When in a memory writing operation, the two phase-change layers are connected in parallel; and when in a memory reading operation, the two layer's resistances are read in serial.

Figure 4:
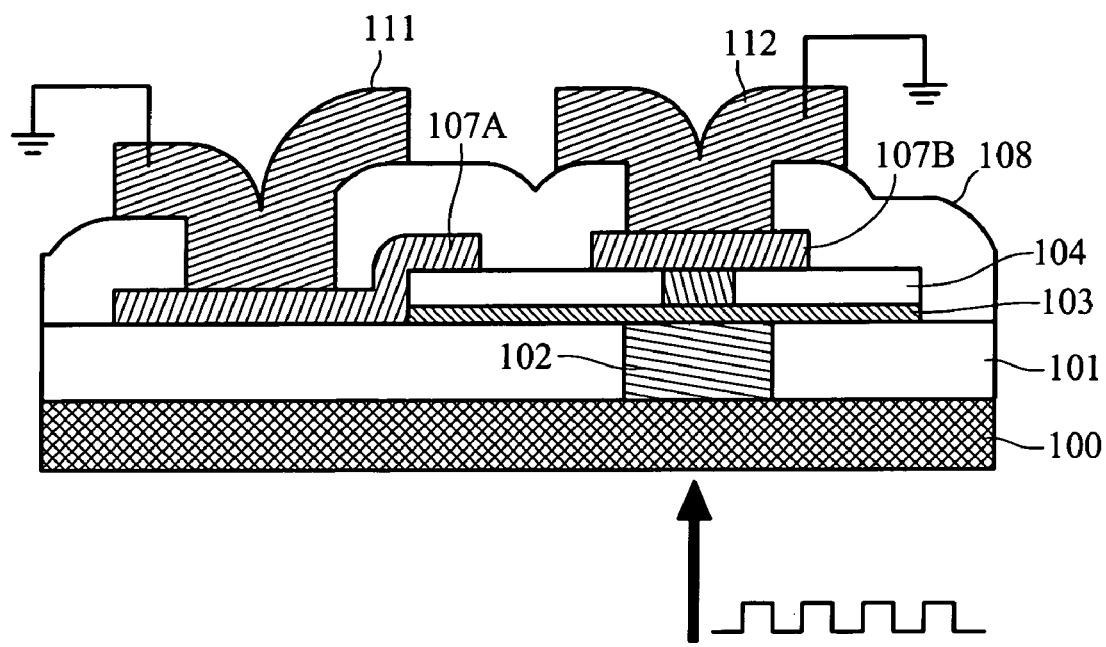
FIG. 4 is the writing operation of the phase-change memory of the present invention.

Referring to FIG. 4, the operation of a writing signal for the phase-change memory is shown. To write, the phase-change layers are changed to different crystal states by the pulses current provided by the transistor, which will generate four different levels. While writing, by grounding the first top electrode 41 and the second top electrode 42, and then applying the writing signal through the bottom electrode 30, the data is written through state changes in the first phase-change layer 10 and the phase-change layer 20. In one embodiment, before writing data, a first control signal is applied to change both the states of the first phase-change layer 10 and the phase-change layer 20 to a non-crystal state; then the writing signal is applied.

Figure 5:
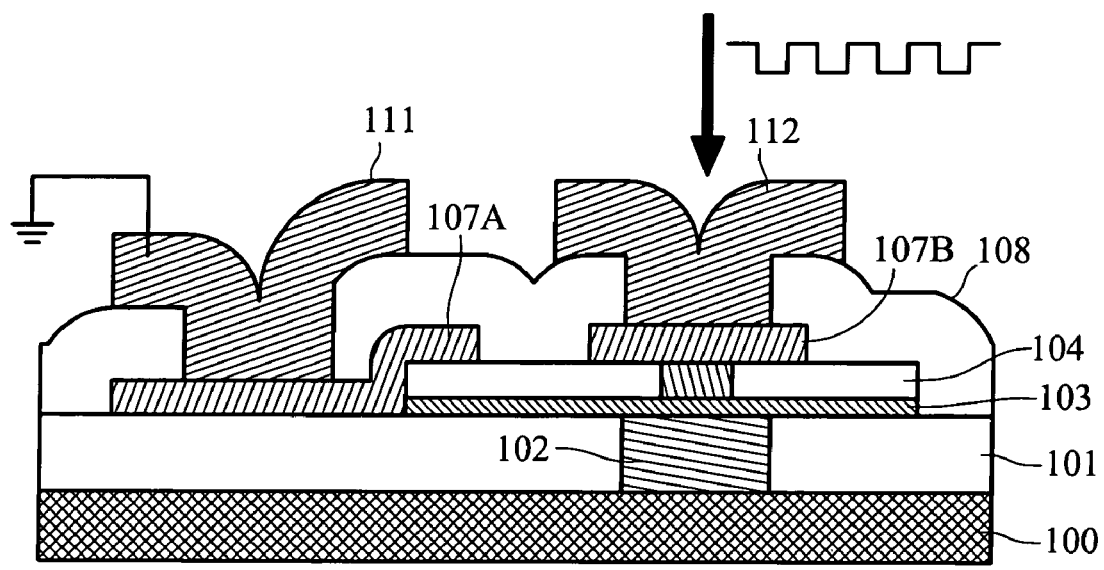
FIG. 5 is the reading operation of the phase-change memory of the present invention.

Referring to FIG. 5, the operation of a reading signal for the phase-change memory is shown, and the area resistance states of two phase-change layers are taken in serial. That is, the first top electrode 41 is grounded and the pulses current is applied through the second top electrode 42, by measuring the current passing through the first phase-change layer 10 and the phase-change layer 20, the crystal states of the first phase-change layer 10 and the phase-change layer 20 will be revealed.

The structure, using one transistor and two phase-change layers of the present invention, takes much less space and power consumption in each cell than the prior art does. The detailed comparison is shown in Table 3, according to the TSMC manufacturing standard of 0.18 μm CMOS.

TABLE 3

|  | Previous Technology | Present Invention |
|---|---|---|
| Re-set current (mA) | 3.38 | 4.89 |
| Reset current per cell (mA) | 3.38 | 2.45 |
| Reset current ratio | 1 | 0.723 |
| Transistor width and length ratio | 14/0.18 | 20/0.18 |
| Memory cell area (μm²) | 0.56 × 0.56 = 0.31 | 1.18 × 0.56 = 0.66 |
| Memory cell area per cell (μm²) | 0.31 | 0.33 |
| Transistor area (μm²) | 3.5 × 2.81 = 9.84 | 4.0 × 3.36 = 13.44 |
| Transistor area per cell (μm²) | 9.84 | 6.72 |
| Area ratio | 1 | 0.683 |

Knowing the invention thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A multilevel phase-change memory, comprising:
   a first phase-change layer;
   a second phase-change layer;
   a first heating layer formed on a first surface of the first phase-change layer;
   a second heating layer formed between the first heating layer and the second phase-change layer;
   a first top electrode formed on a second surface of the first phase-change layer;
   a second top electrode formed on a second surface of the second phase-change layer opposite to the second heating layer; and
   a bottom electrode formed on a second surface of the first heating layer opposite to the second heating layer; wherein the bottom electrode, the first heating layer and the first phase-change layer constitute an electrical current path, the bottom electrode, the first heating layer, the second heating layer and the second phase-change layer constitute another electrical current path, and the resistances of the two electrical current path are different.

2. The multilevel phase-change memory of claim 1, further comprising a substrate, and the bottom electrode is formed on the substrate.

3. The multilevel phase-change memory of claim 2, wherein the substrate includes a transistor.

4. The multilevel phase-change memory of claim 1, wherein the first phase-change layer and the second phase-change layer are made from same material.

5. The multilevel phase-change memory of claim 1, wherein the first phase-change layer and the second phase-change layer are from different material.

6. The multilevel phase-change memory of claim 1, wherein the first electrode and the second electrode are made from same material.

7. The multilevel phase-change memory of claim 1, wherein the first electrode and second electrode are made from different material.

8. The multilevel phase-change memory of claim 1, wherein the phase-change ratios of the first phase-change layer and the second phase-change layer are different, and the resistance of the first heating layer and the second heating layer are different.

9. The multilevel phase-change memory of claim 8, wherein the material of the first phase-change layer and the second phase-change layer is $Ge_2Sb_2Te_5$, the material of the first heating layer is TiN and the material of the second heating layer is SiC.

* * * * *